US010476001B1

(12) United States Patent
Rose et al.

(10) Patent No.: US 10,476,001 B1
(45) Date of Patent: Nov. 12, 2019

(54) MANUFACTURING RF SWITCH BASED ON PHASE-CHANGE MATERIAL

(71) Applicant: Newport Fab, LLC, Newport Beach, CA (US)

(72) Inventors: Jefferson E. Rose, Hawthorne, CA (US); Gregory P. Slovin, Irvine, CA (US); David J. Howard, Irvine, CA (US); Michael J. DeBar, Tustin, CA (US); Nabil El-Hinnawy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/103,490

(22) Filed: Aug. 14, 2018

(51) Int. Cl.
*H01L 45/00* (2006.01)

(52) U.S. Cl.
CPC ......... *H01L 45/1608* (2013.01); *H01L 45/06* (2013.01); *H01L 45/1286* (2013.01); *H01L 45/143* (2013.01); *H01L 45/144* (2013.01); *H01L 45/1675* (2013.01)

(58) Field of Classification Search
None
See application file for complete search history.

(56) References Cited

U.S. PATENT DOCUMENTS

| | | | |
|---|---|---|---|
| 5,976,932 A | 11/1999 | Kerber | |
| 6,448,576 B1 * | 9/2002 | Davis | H01L 23/5256 257/50 |
| 6,969,869 B2 * | 11/2005 | Hudgens | H01L 23/5256 257/50 |
| 9,257,647 B2 | 2/2016 | Borodulin | |
| 9,362,492 B2 | 6/2016 | Goktepeli | |
| 9,368,720 B1 * | 6/2016 | Moon | H01L 45/1286 |
| 9,640,759 B1 * | 5/2017 | Curioni | H01L 45/149 |
| 9,917,104 B1 | 3/2018 | Roizin | |
| 2006/0246712 A1 * | 11/2006 | Kim | H01L 27/2427 438/622 |

(Continued)

FOREIGN PATENT DOCUMENTS

WO    WO 2016/028362    2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.

(Continued)

*Primary Examiner* — Evren Seven
(74) *Attorney, Agent, or Firm* — Farjami & Farjami LLP

(57) ABSTRACT

In manufacturing a radio frequency (RF) switch, a heat spreader is provided. A first dielectric is deposited over the heat spreader. A trench is etched in the first dielectric. A heating element is deposited in the trench and over at least a portion of the first dielectric. A thermally conductive and electrically insulating material is deposited over at least the heating element, where the thermally conductive and electrically insulating material is self-aligned with the heating element. A conformability support layer is optionally deposited over the thermally conductive and electrically insulating material and the first dielectric. A phase-change material is deposited over the optional conformability support layer and the underlying thermally conductive and electrically insulating material and the first dielectric.

19 Claims, 10 Drawing Sheets

(56) References Cited

U.S. PATENT DOCUMENTS

| | | | |
|---|---|---|---|
| 2007/0075347 A1* | 4/2007 | Lai | H01L 45/06 |
| | | | 257/296 |
| 2013/0187120 A1* | 7/2013 | Redaelli | H01L 45/06 |
| | | | 257/5 |
| 2013/0285000 A1* | 10/2013 | Arai | H01L 45/128 |
| | | | 257/3 |
| 2014/0264230 A1* | 9/2014 | Borodulin | H01L 45/126 |
| | | | 257/4 |
| 2015/0090949 A1* | 4/2015 | Chang | H01L 45/1253 |
| | | | 257/4 |
| 2016/0035973 A1* | 2/2016 | Raieszadeh | H01L 45/06 |
| | | | 257/4 |
| 2016/0071653 A1 | 3/2016 | Lamorey | |
| 2017/0092694 A1* | 3/2017 | BrightSky | H01L 27/2463 |
| 2017/0365427 A1* | 12/2017 | Borodulin | H01L 45/06 |
| 2018/0005786 A1 | 1/2018 | Navarro | |
| 2018/0269393 A1* | 9/2018 | Zhang | H01L 45/126 |
| 2019/0064555 A1* | 2/2019 | Hosseini | G02F 1/0147 |
| 2019/0067572 A1* | 2/2019 | Tsai | H01L 45/1286 |

OTHER PUBLICATIONS

G. Slovin, et al., "Design Criteria in Sizing Phase-Change RF Switches," in *IEEE Transactions on Microwave Theory and Techniques,* vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS),* Monterey, CA, 2013, pp. 1-4.

* cited by examiner

Deposit Conformability Support Layer

Deposit Phase Change Material

Deposit Contact Uniformity Support Layer

MANUFACTURING RF SWITCH BASED ON PHASE-CHANGE MATERIAL

RELATED APPLICATION(S)

The present application is related to U.S. patent application Ser. No. 16/103,587, filed on Aug. 14, 2018, and titled "Design for High Reliability RF Switch Based on Phase-Change Material," and U.S. patent application Ser. No. 16/103,646, filed on Aug. 14, 2018, and titled "PCM RF Switch Fabrication with Subtractively Formed Heater." The disclosures of these related applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds. This presents a particular challenge for switching devices to prevent degradation due to high thermal energy while achieving fast switching times.

Additionally, the ongoing need for miniaturization introduces upper limits on driving voltages as well as overall device dimensions, often creating tradeoffs with parasitics associated with RF frequencies and resulting in performance tradeoffs. Accordingly, accommodating PCM in RF switches can present significant manufacturing challenges. Specialty manufacturing is often impractical, and large scale manufacturing generally trades practicality for the ability to control device characteristics and critical dimensions.

Thus, there is a need in the art for reliably manufacturing low voltage and low parasitics PCM RF switches on a large scale.

SUMMARY

The present disclosure is directed to manufacturing a radio frequency (RF) switch based on phase-change material (PCM), substantially as shown in and/or described in connection with at least one of the figures, and as set forth in the claims.

DETAILED DESCRIPTION

Figure 1A:
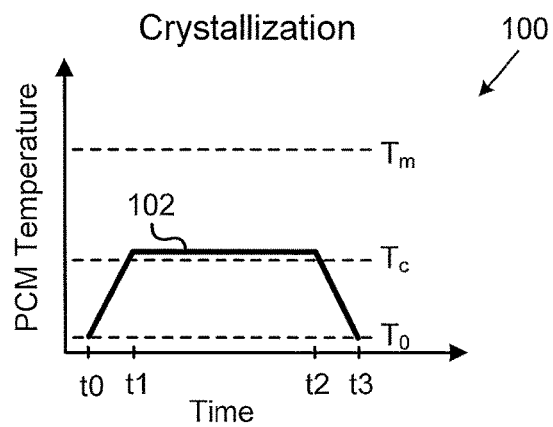
FIG. 1A illustrates an exemplary graph of phase-change material (PCM) temperature versus time according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1B:
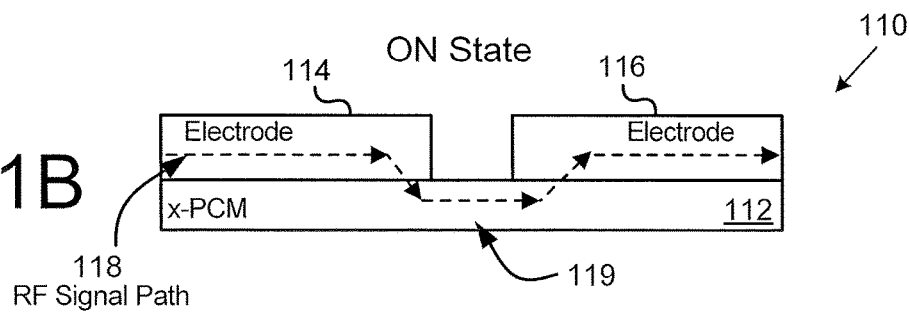
FIG. 1B illustrates a portion of an exemplary PCM radio frequency (RF) switch in an ON state according to one implementation of the present application.

Prior to a description of manufacturing methods according to the present application, some relevant concepts in relation to radio frequency (RF) switches based on phase-change material (PCM) are discussed by reference to FIGS. 1A through 2C. FIG. 1A illustrates an exemplary graph of PCM temperature versus time according to one implementation of the present application. As illustrated in FIG. 1A, PCM temperature-time graph 100 includes trace 102 which represents the temperature of an "active segment" of a PCM, such as active segment 119 of PCM 112 in FIG. 1B, plotted over time when a crystallizing heat pulse is applied to the PCM. It is noted that, according to the present application, "active segment" of the PCM is that portion of the PCM that undergoes a phase change in response to a crystallizing or an amorphizing heat pulse and generally lies between electrical contacts (or electrodes) on each end of the PCM, whereas the "passive segment" of the PCM is that portion of the PCM that is generally not subject to a crystallizing or an amorphizing heat pulse and does not undergo a phase change. As shown in FIG. 1A, from time t0 to time t1, trace 102 rises from initial temperature $T_0$ to approximately above crystallization temperature $T_C$. From time t1 to time t2, trace 102 remains approximately above crystallization temperature $T_C$. From time t2 to time t3, trace 102 falls from approximately above crystallization temperature $T_C$ to approximately initial temperature $T_0$.

A heat pulse that holds the PCM at or above crystallization temperature $T_C$ for a sufficient amount of time will transform the PCM into a crystalline state. Accordingly, such a pulse may be referred to as a crystallizing pulse in the present application. Crystallization temperature $T_C$ depends on the PCM material. In one implementation, crystallization temperature $T_C$ can be approximately two hundred degrees Celsius (200° C.). The amount of time needed to transform the PCM into a crystalline state depends on the material, dimensions, temperature, and thermal conductivity of both the PCM and its surrounding structures. In one implementation, the time required can be approximately one microsecond (1 µs) or greater or less. In the present exemplary implementation, the duration from time t1 to time t2 in PCM temperature-time graph 100 can be approximately one microsecond (1 µs), and thus, trace 102 represents a crystallizing pulse (trace 102 is also referred to as crystallizing pulse 102 in the present application).

FIG. 1B illustrates a portion of an exemplary PCM RF switch according to one implementation of the present application. As illustrated in FIG. 1B, PCM RF switch 110 includes PCM 112, input electrode 114, output electrode 116, and RF signal path (or simply referred to as "RF signal") 118. FIG. 1B illustrates PCM RF switch 110 after a crystallizing pulse is applied to PCM 112. PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from 40% to 60% germanium by composition (i.e., $Ge_XTe_Y$, where $0.4 \leq X \leq 0.6$ and $Y=1-X$). As shown in FIG. 1B, PCM 112 is uniform and is denoted with the label "x-PCM," to indicate that PCM 112 is in the crystalline state. PCM 112 in the crystalline state has low resistivity and is able to easily conduct electrical current. Accordingly, RF signal 118 propagates along a path from input electrode 114, through PCM 112, to output electrode 116. It is noted that input electrode 114 and output electrode 116 can be substantially symmetrical and that their roles in PCM RF switch 110 can be reversed. PCM RF switch 110 in FIG. 1B is in an ON state.

Figure 1C:
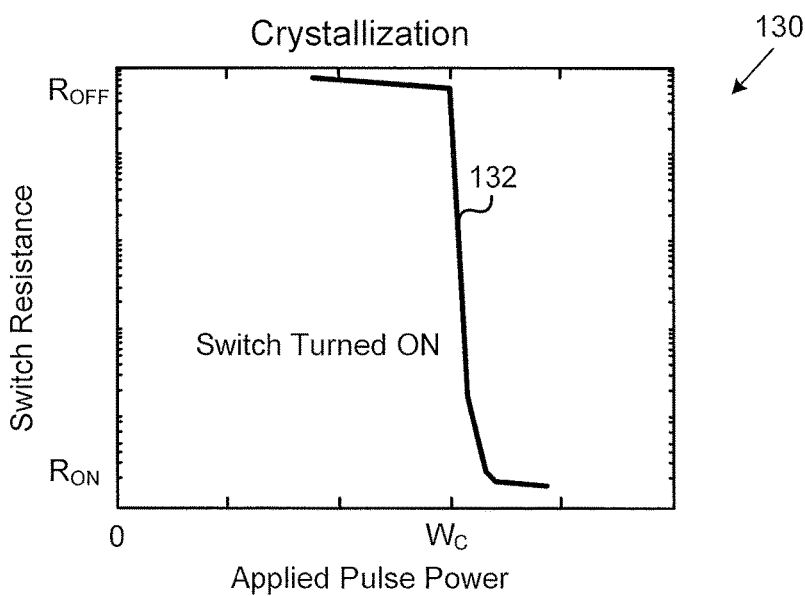
FIG. 1C illustrates an exemplary graph of switch resistance versus applied pulse power according to one implementation of the present application.

FIG. 1C illustrates an exemplary graph of switch resistance versus applied pulse power according to one implementation of the present application. As illustrated in FIG. 1C, switch resistance-applied pulse power graph 130 includes trace 132 that represents the resistance of PCM RF switch 110 in FIG. 1B, seen across input electrode 114 and output electrode 116, in response to a crystallizing pulse applied to PCM 112. As shown in FIG. 1C, when the pulse power increases past crystallization power $W_C$ (i.e., past the power needed to heat PCM 112 to crystallization temperature $T_C$), switch resistance decreases from $R_{OFF}$ to $R_{ON}$ as shown by trace 132. In one implementation, crystallization power $W_C$ can be approximately three tenths of a Watt (0.3 W). In various implementations, $R_{OFF}$ can range from approximately ten kilo-Ohms to approximately one mega-Ohm (10 k$\Omega$-1M$\Omega$). In one implementation, $R_{ON}$ can be approximately one Ohm (1$\Omega$). Thus, trace 132 corresponds to PCM RF switch 110 turning ON in response to a crystallizing pulse.

Figure 2A:
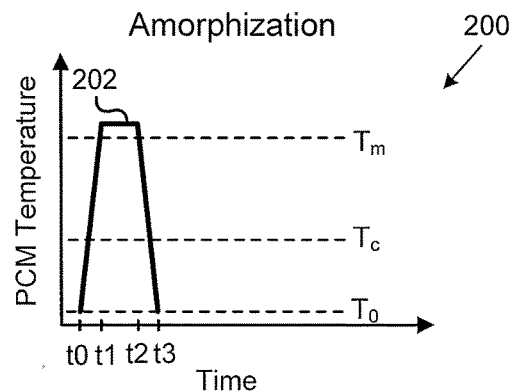
FIG. 2A illustrates an exemplary graph of PCM temperature versus time according to one implementation of the present application.
Figure 2B:
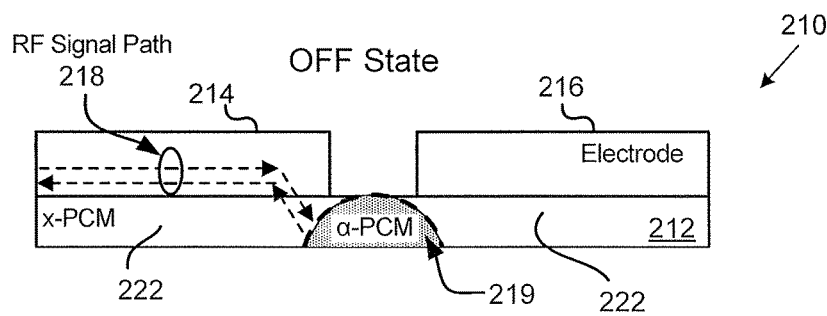
FIG. 2B illustrates a portion of an exemplary PCM RF switch in an OFF state according to one implementation of the present application.

FIG. 2A illustrates an exemplary graph of PCM temperature versus time according to one implementation of the present application. As illustrated in FIG. 2A, PCM temperature-time graph 200 includes trace 202 which represents the temperature of an "active segment" of a PCM, such as active segment 219 of PCM 212 in FIG. 2B, plotted over time when an amorphizing heat pulse is applied to the PCM. It is noted that, according to the present application, "active segment" of the PCM is that portion of the PCM that undergoes a phase change in response to a crystallizing or an amorphizing heat pulse and generally lies between electrical contacts (or electrodes) on each end of the PCM, whereas the "passive segment" of the PCM is that portion of the PCM that is generally not subject to a crystallizing or an amorphizing heat pulse and does not undergo a phase change. As shown in FIG. 2A, from time t0 to time t1, trace 202 rises from initial temperature $T_0$ to approximately above melting temperature $T_M$. From time t1 to time t2, trace 202 remains approximately above melting temperature $T_M$. From time t2 to time t3, trace 202 falls from approximately above melting temperature $T_M$ to approximately initial temperature $T_0$. Notably, from time t0 to time t3, trace 202 in FIG. 2A rises and falls more quickly than trace 102 in FIG. 1A.

A heat pulse that melts and rapidly quenches the PCM from a temperature at or above melting temperature $T_M$ will transform the PCM into an amorphous state. Accordingly, such a pulse may be referred to as an amorphizing pulse in the present application. Melting temperature $T_M$ depends on the PCM material. In one implementation, melting temperature $T_M$ can be approximately seven hundred degrees Celsius (700° C.). How rapidly the PCM must be quenched in order to transform the PCM into an amorphous state depends on the material, dimensions, temperature, and thermal conductivity of both the PCM and its surrounding structures. In one implementation, the quench time window can be approximately one hundred nanoseconds (100 ns) or greater or less. In this implementation, the duration from time t2 to time t3 in PCM temperature graph 200 can be approximately one hundred nanoseconds (100 ns), and thus, trace 202 represents an amorphizing pulse (trace 202 is also referred to as amorphizing pulse 202 in the present application).

FIG. 2B illustrates a portion of an exemplary PCM RF switch according to one implementation of the present application. As illustrated in FIG. 2B, PCM RF switch 210 includes PCM 212, input electrode 214, output electrode 216, and RF signal path (or simply referred to as "RF signal") 218. FIG. 2B illustrates PCM RF switch 210 after an amorphizing pulse is applied to PCM 212. PCM RF switch 210 in FIG. 2B generally corresponds to PCM RF switch 110 in FIG. 1B, and may have any of the implementations and advantages thereof. As shown in FIG. 2B, PCM 212 is not uniform. PCM 212 includes active segment 219, and passive segments 222. As used herein, "active segment" refers to a segment of PCM that transforms between crystalline and amorphous states, for example, in response to heat pulses, whereas "passive segment" refers to a segment of PCM that does not make such transformation and maintains a crystalline state (i.e. maintains a conductive state). Active segment 219 is denoted with the label "α-PCM," to indicate that active segment 219 is in the amorphous state. Passive segments 222 are denoted with the label "x-PCM," to indicate that passive segments 222 are in the crystalline state. PCM 212 in the amorphous state has high resistivity and is not able to conduct electrical current well. Accordingly, RF signal 218 does not propagate along a path from input electrode 214, through PCM 212, to output electrode 216. It is noted that input electrode 214 and output electrode 216 can be substantially symmetrical and that their roles in PCM RF switch 210 can be reversed. PCM RF switch 210 in FIG. 2B is in an OFF state.

Figure 2C:
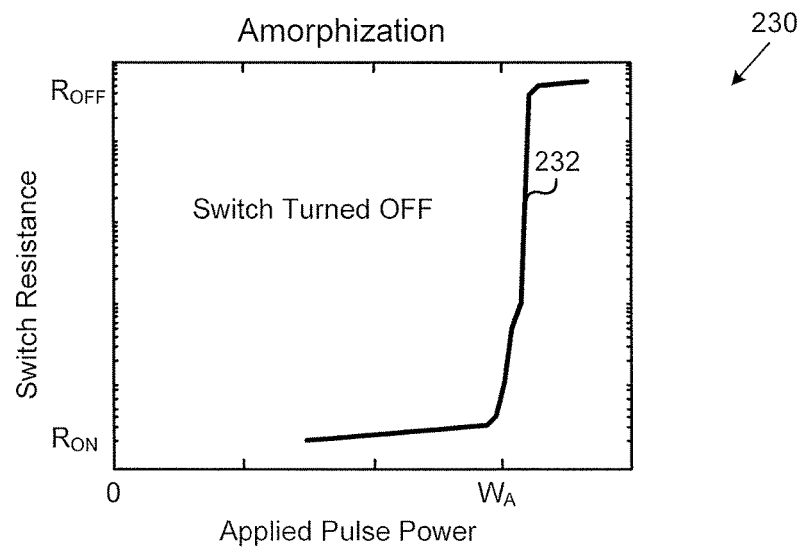
FIG. 2C illustrates an exemplary graph of switch resistance versus applied pulse power according to one implementation of the present application.

FIG. 2C illustrates an exemplary graph of switch resistance versus applied pulse power according to one implementation of the present application. As illustrated in FIG. 2C, switch resistance graph 230 includes trace 232 that represents the resistance of PCM RF switch 210 in FIG. 2B, seen across input electrode 214 and output electrode 216, in response to an amorphizing pulse is applied to PCM 212. As shown in FIG. 2C, when the pulse power increases past amorphization power $W_A$ (i.e., past the power needed to heat PCM 212 to melting temperature $T_M$), switch resistance increases from $R_{ON}$ to $R_{OFF}$ as shown by trace 232. In one implementation, amorphization power $W_A$ can be approximately one and a half Watts (1.5 W). In various implementations, $R_{OFF}$ can range from approximately ten kilo-Ohms to approximately one mega-Ohm (10 k$\Omega$-1M$\Omega$). In one implementation, $R_{ON}$ can be approximately one Ohm (1$\Omega$).

Thus, trace 232 represents PCM RF switch 210 turning OFF in response to an amorphizing pulse.

Figure 3A:
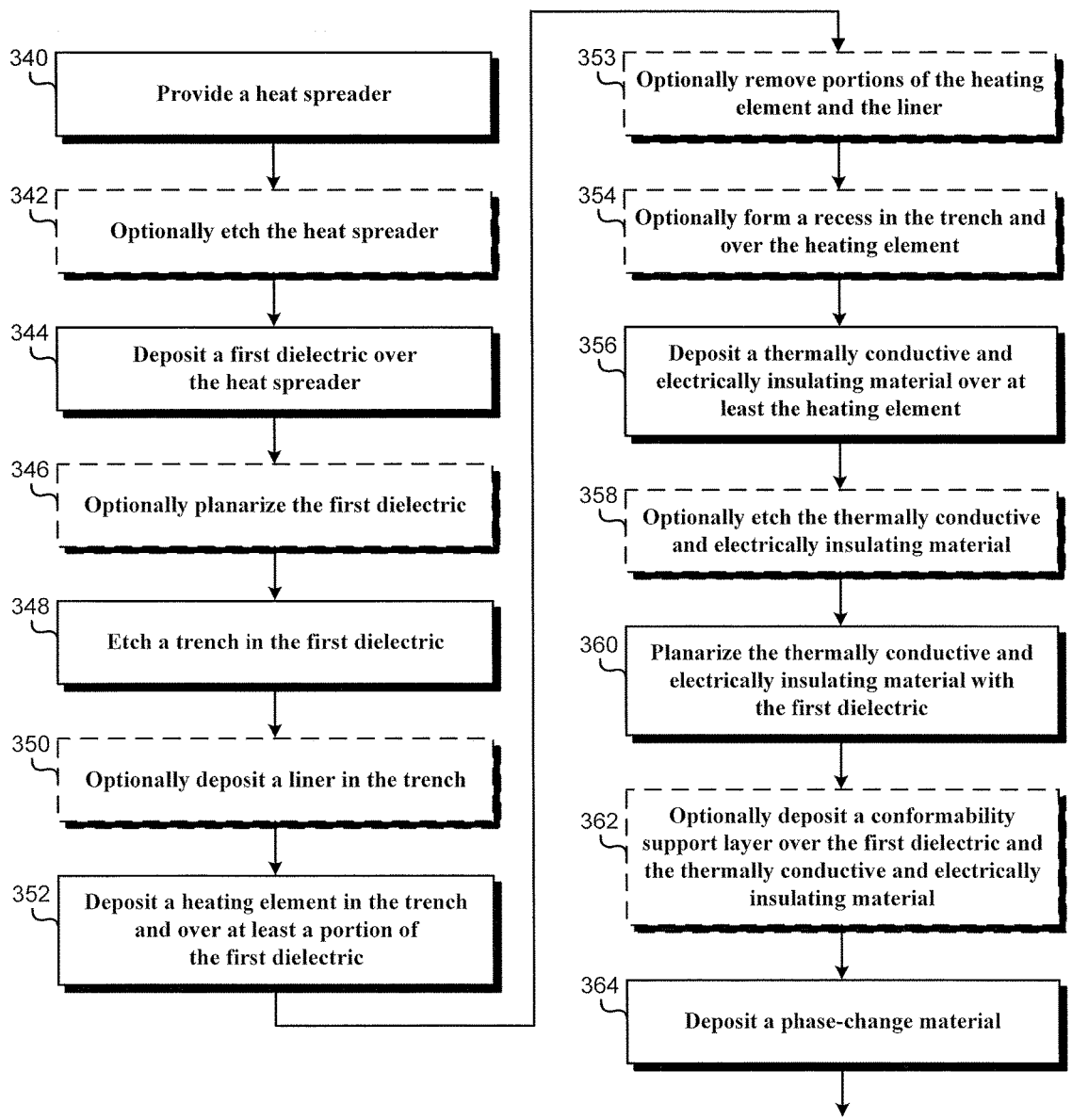
FIGS. 3A and 3B illustrate a flowchart of an exemplary method for manufacturing a PCM RF switch according to one implementation of the present application.

FIG. 3A illustrates a portion of a flowchart of an exemplary method for manufacturing a PCM RF switch according to one implementation of the present application. Certain details and features have been left out of the flowchart that are apparent to a person of ordinary skill in the art. For example, an action may consist of one or more subactions or may involve specialized equipment or materials, as known in the art. Moreover, some actions, such as masking and cleaning actions, are omitted so as not to distract from the illustrated actions. Actions shown with dashed lines are considered optional. Actions 340 through 364 shown in the flowchart of FIG. 3A are sufficient to describe one implementation of the present inventive concepts, other implementations of the present inventive concepts may utilize actions different from those shown in the flowchart of FIG. 3A. Moreover, structures shown in FIGS. 4 through 17 illustrate the results of performing actions 340 through 364 in the flowchart of FIG. 3A, respectively.

Figure 4:
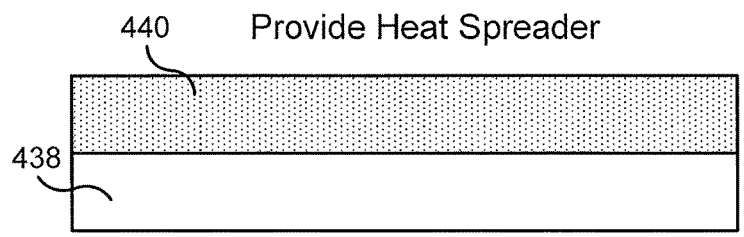
FIGS. 4 through 21 each illustrate actions according to an exemplary method for manufacturing a PCM RF switch according to one implementation of the present application.

The method begins with action 340 by providing a heat spreader. Referring to FIG. 4, heat spreader 440 is provided over substrate 438. Heat spreader 440 may be any material with high thermal conductivity. In one implementation, heat spreader 440 may be a material with both high thermal conductivity and high electrical resistivity. In various implementations, heat spreader 440 can comprise aluminum nitride (AlN), aluminum oxide ($Al_xO_Y$), beryllium oxide ($Be_xO_Y$), silicon carbide (SiC), diamond, or diamond-like carbon. Heat spreader 440 can be provided, for example, by physical vapor deposition (PVD), chemical vapor deposition (CVD), or plasma enhanced chemical vapor deposition (PECVD). In one implementation, substrate 438 is an insulator, such as silicon oxide ($SiO_2$). In various implementations, substrate 438 is a silicon (Si), silicon-on-insulator (SOI), sapphire, complementary metal-oxide-semiconductor (CMOS), bipolar CMOS (BiCMOS), or group III-V substrate. In one implementation, heat spreader 440 itself performs as a substrate and a separate substrate is not used. For example, heat spreader 440 can comprise Si and be provided without substrate 438. In one implementation, heat spreader 440 can be integrated with substrate 438.

Figure 5:
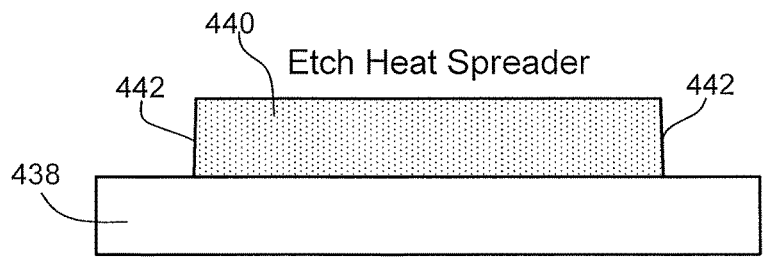

The method optionally continues with action 342 by etching the heat spreader. Referring to FIG. 5, outer segments of heat spreader 440 are etched away, leaving sides 442. In one implementation, plasma dry etching is used for anisotropic etching of heat spreader 440 on substrate 438. In one implementation, the anisotropic etching in action 342 leaves strain-relieving chamfers (not shown) at sides 442. It is noted that action 342 is an optional action since heat spreader 440 does not have to be necessarily etched, and in some implementations heat spreader 440 can remain coextensive with substrate 438.

Figure 6:
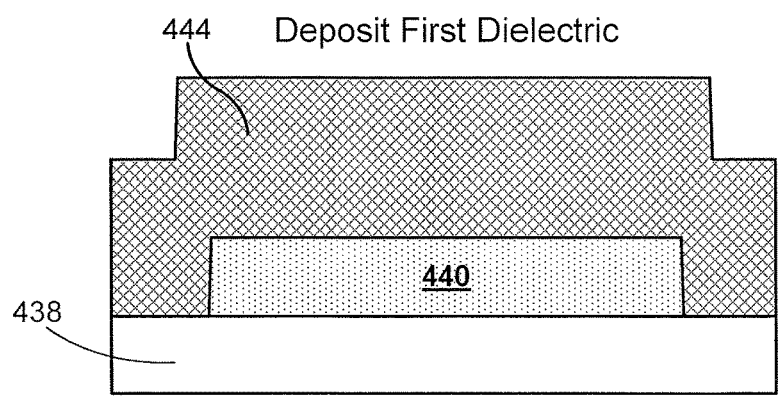

The method continues with action 344 by depositing a first dielectric over the heat spreader. Referring to FIG. 6, first dielectric 444 is deposited over heat spreader 440 which is in turn situated over substrate 438. In one implementation, first dielectric 444 is $SiO_2$. In other implementations, first dielectric 444 is silicon nitride ($Si_xN_Y$), or another dielectric. First dielectric 444 can be deposited, for example, by PECVD or high density plasma CVD (HDP-CVD).

Figure 7:
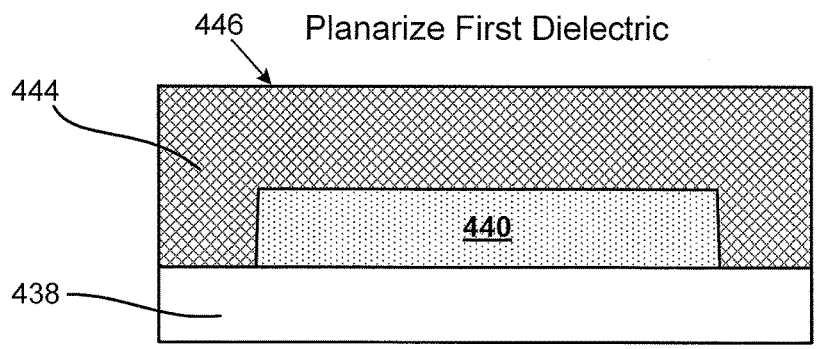

The method optionally continues with action 346 by planarizing the first dielectric. Referring to FIG. 7, first dielectric 444 is planarized so as to have substantially planar top surface 446. In one implementation, chemical machine polishing (CMP) is used to planarize first dielectric 444. Substrate 438 underlies first dielectric 444 and heat spreader 440. Action 346 is optional in that the inventive concepts of the present application may be implemented without planarizing first dielectric 444. For example, where action 342 of optionally etching heat spreader 440 is omitted, first dielectric 444 can be substantially planar upon being deposited in action 344, and action 346 of planarizing first dielectric 444 can be omitted.

Figure 8:
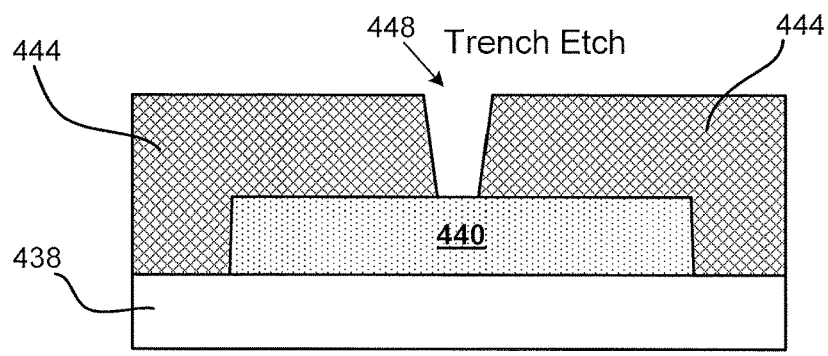

The method continues with action 348 by etching a trench in the first dielectric. Referring to FIG. 8, trench 448 is etched in first dielectric 444. As shown in FIG. 8, in the present exemplary implementation, trench 448 is etched entirely through first dielectric 444 to reach heat spreader 440. In this implementation, heat spreader 440 may perform as an etch stop while first dielectric 444 is selectively etched. The materials for heat spreader 440, first dielectric 444, and the etchant used to etch trench 448 can be chosen such that the etchant used to etch trench 448 is highly selective of first dielectric 444 but stops at heat spreader 440. Thus, the depth of trench 448 will substantially match the thickness of first dielectric 444 above heat spreader 440, and the depth of trench 448 can be reliably controlled. For example, in one implementation, both the thickness of first dielectric 444 above heat spreader 440 and the depth of trench 448 are approximately five thousands angstroms (5000 Å). In other implementations, trench 448 can be etched only partially through first dielectric 444 without reaching heat spreader 440; or trench 448 can reach heat spreader 440 and be etched partially into heat spreader 440. In one implementation, dry etching is used to etch trench 448. Substrate 438 underlies first dielectric 444 and heat spreader 440.

Figure 9:
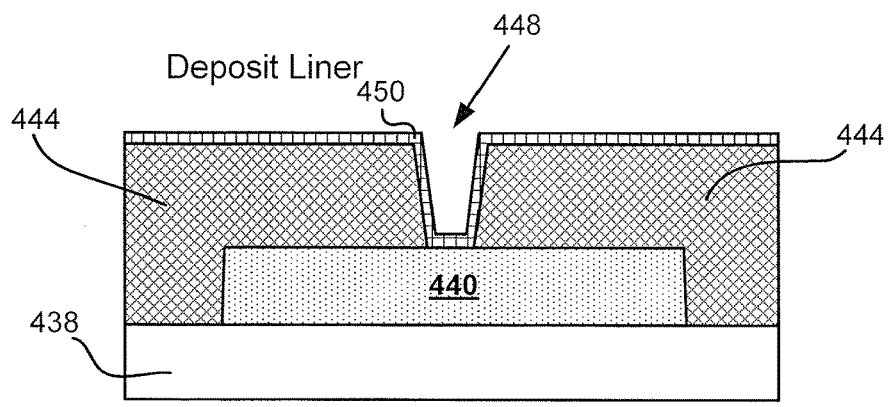

The method optionally continues with action 350 by depositing a liner in the trench. As shown in FIG. 9, liner 450 is deposited over first dielectric 444 and in trench 448. In one implementation, liner 450 can comprise $SiO_2$. Liner 450 can be deposited, for example, by PECVD or HDP-CVD. In one implementation, liner 450 can have a thickness of approximately two hundred angstroms to approximately five hundred angstroms (200 Å-500 Å). Substrate 438 underlies first dielectric 444 and heat spreader 440. Action 350 is optional in that the inventive concepts of the present application may be implemented without depositing liner 450. For example, where trench 448 is etched only partially through first dielectric 444 without reaching heat spreader 440, action 350 of depositing liner 450 can be omitted. As another example, where trench 448 is etched entirely through first dielectric 444 to reach heat spreader 440, action 350 of depositing liner 450 can be omitted, and a heating element can be deposited directly over heat spreader 440 in a subsequent heating element deposition action.

Figure 10:
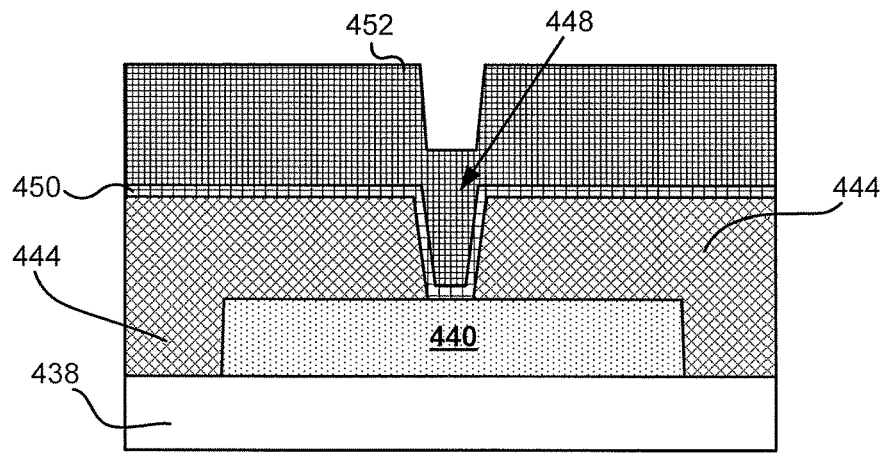

The method continues with action 352 by depositing a heating element in the trench and over at least a portion of the first dielectric. Referring to FIG. 10, heating element 452 is deposited in trench 448 and over portions of first dielectric 444. Heating element 452 is also deposited over liner 450 (in case optional liner 450 is utilized). In one implementation, heating element 452 can be deposited, for example, by CVD. Heating element 452 can comprise any material capable of Joule heating that has a melting temperature higher than that of a PCM, such as PCM 464 in FIG. 17. Preferably, heating element 452 comprises a material that exhibits little or substantially no electromigration. In various implementations, heating element 452 can comprise tungsten (W), molybdenum (Mo), titanium (Ti), titanium nitride (TiN), titanium tungsten (TiW), tantalum (Ta), nickel chromium (NiCr), or nickel chromium silicon (NiCrSi). For example, in one implementation, heating element 452 comprises tungsten lined with titanium and titanium nitride. In one implementation, heating element 452 can have a thickness of approximately five hundred angstroms to approximately five thousand angstroms (500 Å-5000 Å). As further shown in FIG. 10, substrate 438 underlies first dielectric 444 and heat spreader 440.

Figure 11:
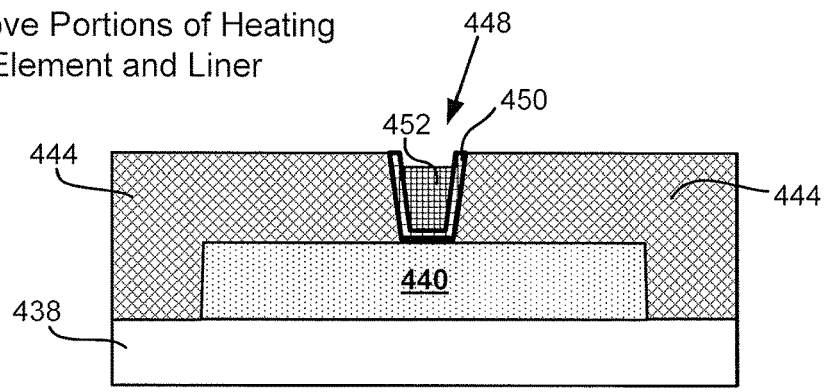

The method optionally continues with action 353 by removing portions of the heating element and the liner. Referring to FIG. 11, portions of heating element 452 and liner 450 (in case optional liner 450 is utilized) over first dielectric 444 are removed, for example, by CMP. As shown in FIG. 11, the top surface of heating element 452 is below the top surface of first dielectric 444 due to dishing caused by the CMP in action 353. In one implementation, prior to the CMP, outer segments of heating element 452 and liner 450 (in case optional liner 450 is utilized) are etched away, for example, using a plasma dry etching. In this implementation, after etching heating element 452 and liner 450 (in case optional liner 450 is utilized), first dielectric 444 is substantially wider than overlying heating element 452 and liner 450 (in case optional liner 450 is utilized). Accordingly, a substantial difference in mechanical resistance at the boundary between first dielectric 444 and heating element 452 (or at the boundary between first dielectric 444 and liner 450) can be easily detected during the CMP, and used to end the CMP at a desired depth. Action 353 is optional in that the inventive concepts of the present application may be implemented without removing portions of heating element 452 and liner 450. For example, in one implementation, heating element 452 and liner 450 (in case optional liner 450 is utilized) can be selectively deposited in trench 448, and action 353 of removing portions of heating element 452 and liner 450 can be omitted.

Figure 12:
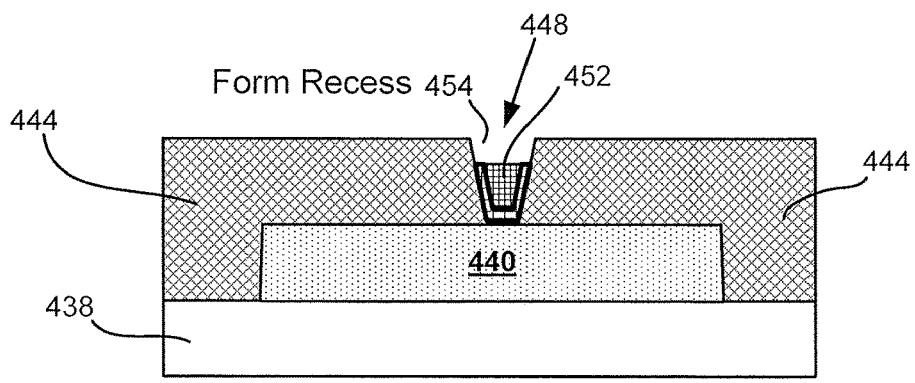

The method optionally continues with action 354 by forming a recess in the trench and over at least the heating element. Referring to FIG. 12, recess 454 is formed in trench 448 over heating element 452. In one implementation, an etch back, for example a tungsten etch back if heating element 452 comprises tungsten, can be used to form recess 454. As described below, forming recess 454 according to the present application enables control over critical dimensions of PCM RF switches, while being suitable for large scale manufacturing. In one implementation, recess 454 can have a depth of approximately five hundred angstroms to approximately five thousand angstroms (500 Å-5000 Å). As further shown in FIG. 12, substrate 438 underlies first dielectric 444 and heat spreader 440. Action 354 is optional in that the inventive concepts of the present application may be implemented without forming recess 454. For example, where a deposition thickness of heating element 452 during deposition action 352 is less than a depth of trench 448, a recess may already exist in trench 448, and action 354 of forming recess 454 can be omitted. As another example, in one implementation, heating element 452 can be selectively deposited in trench 448 such that a recess may already exist in trench 448, and action 354 of forming recess 454 can be omitted. As yet another example, the CMP in action 353 may remove portions of heating element 452 faster than portions of first dielectric 444 such that a recess may already exist in trench 448. In one implementation, the CMP in action 353 may remove portions of first dielectric 444 faster than portions of heating element 452 such that heating element 452 protrudes above first dielectric 444. In this implementation, action 354 of forming recess 454 may include additional processing actions performed prior to the etch back.

Figure 13:
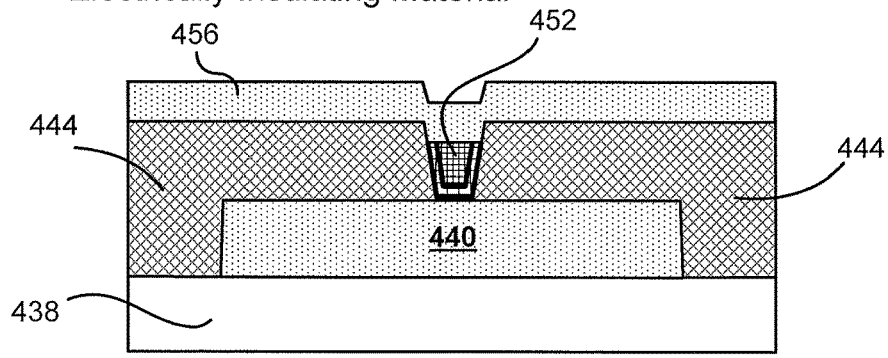

The method continues with action 356 by depositing a thermally conductive and electrically insulating material over at least the heating element. Referring to FIG. 13, thermally conductive and electrically insulating material 456 is deposited over heating element 452 and over portions of first dielectric 444. Thermally conductive and electrically insulating material 456 may be any material with high thermal conductivity and high electrical resistivity. In various implementations thermally conductive and electrically insulating material 456 can comprise AlN, $Al_xO_y$, $Be_xO_y$, SiC, $Si_xN_y$, diamond, or diamond-like carbon. Thermally conductive and electrically insulating material 456 can be deposited, for example, by PVD, CVD, or PECVD. As shown in FIG. 13, thermally conductive and electrically insulating material 456 substantially fills recess 454 that was shown in FIG. 12. In one implementation, thermally conductive and electrically insulating material 456 can have a thickness of approximately five hundred angstroms to approximately five thousand angstroms (500 Å-5000 Å). Also shown in FIG. 13 is substrate 438 that underlies first dielectric 444 and heat spreader 440.

Figure 14:
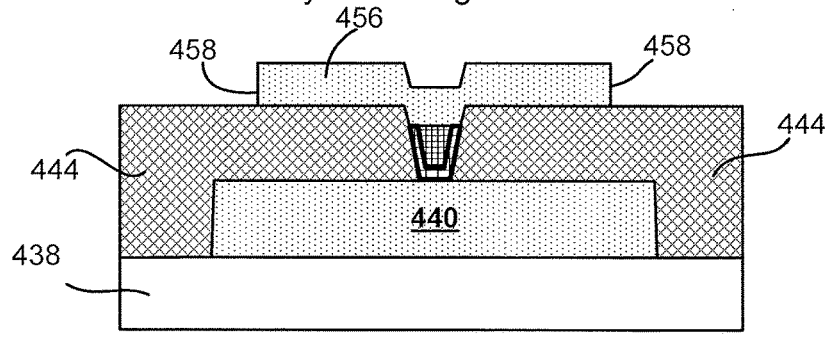

The method optionally continues with action 358 by etching the thermally conductive and electrically insulating material. Referring to FIG. 14, outer segments of thermally conductive and electrically insulating material 456 are etched away, forming sides 458. In one implementation, a plasma dry etching is used. In the exemplary implementation shown in FIG. 14, after etching thermally conductive and electrically insulating material 456, first dielectric 444 is substantially wider than overlying thermally conductive and electrically insulating material 456. Accordingly, a substantial difference in mechanical resistance at the boundary between first dielectric 444 and thermally conductive and electrically insulating material 456 can be easily detected during a subsequent planarization action, and used to end the planarization at a desired depth. Further shown in FIG. 14 is substrate 438 that underlies first dielectric 444 and heat spreader 440. Action 358 is optional in that the inventive concepts of the present application may be implemented without etching thermally conductive and electrically insulating material 456.

Figure 15:
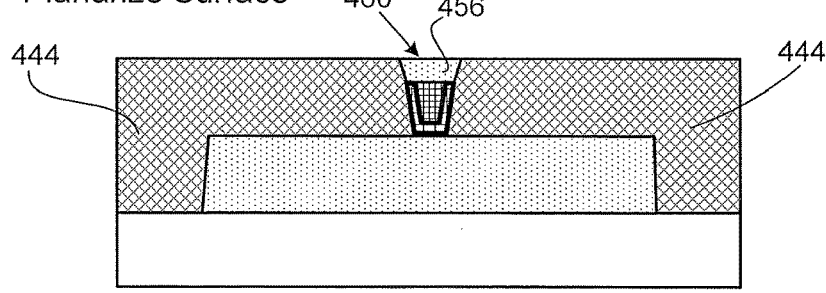

The method continues with action 360 by planarizing the thermally conductive and electrically insulating material with the first dielectric. Referring to FIG. 15, thermally conductive and electrically insulating material 456 is planarized with first dielectric 444 to form planar surface 460. In one implementation, CMP is used to planarize thermally conductive and electrically insulating material 456 with first dielectric 444. In one implementation, any other planarization technique may be used.

Figure 16:
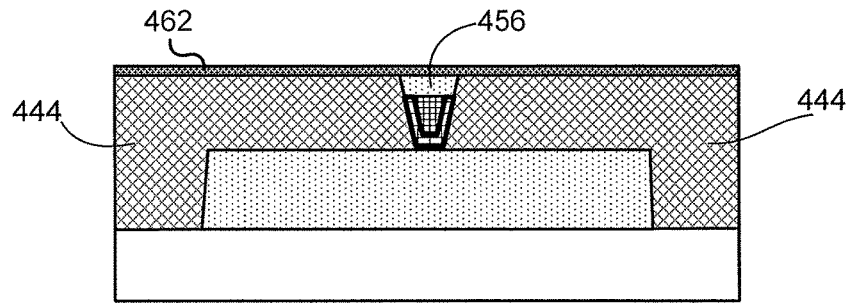

The method optionally continues with action 362 with depositing a "conformability support layer" over the first dielectric and the thermally conductive and electrically insulating material. Referring to FIG. 16, conformability support layer 462 is deposited over thermally conductive and electrically insulating material 456 and first dielectric 444. In one implementation, conformability support layer 462 is $Si_xN_y$. In another implementation, conformability support layer 462 is $SiO_2$. Conformability support layer 462 can be deposited, for example, by PECVD or HDP-CVD. In one implementation, conformability support layer 462 can have a thickness of approximately fifty angstroms to approximately five hundred angstroms (50 Å-500 Å). According to the present application, "conformability support layer" is a homogenous layer that allows a subsequent deposition to be substantially uniform with respect to that layer. By optionally depositing conformability support layer 462, during a subsequent PCM deposition action, PCM can be deposited on a homogenous surface, thereby allowing the deposited PCM to be substantially uniform with respect to that surface. If conformability support layer 462 were not used, subsequently deposited PCM would be deposited on a non-homogeneous surface of thermally conductive and electrically insulating material 456 and first dielectric 444, and non-conformities are likely to occur in the subsequently deposited PCM, particularly around interfaces of thermally conductive and electrically insulating material 456 and first dielectric 444. Action 362 is optional in that the inventive concepts of the present application may be implemented without depositing conformability support layer 462.

Figure 17:
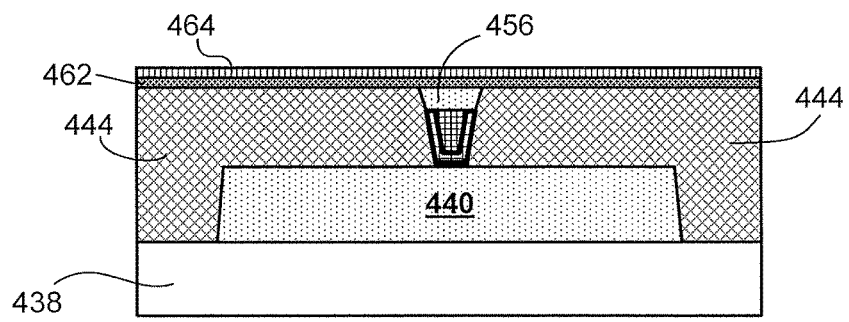

The method continues with action 364 by depositing phase-change material. Referring to FIG. 17, PCM 464 is deposited over conformability support layer 462 (in case optional layer 462 is utilized) and over first dielectric 444 and thermally conductive and electrically insulating material 456. PCM 464 can be germanium telluride ($Ge_XTe_Y$), germanium antimony telluride ($Ge_XSb_YTe_Z$), germanium selenide ($Ge_XSe_Y$), or any other chalcogenide. In various implementations, PCM 464 can be germanium telluride having from forty percent to sixty percent germanium by composition (i.e., $Ge_XTe_Y$, where $0.4 \leq X \leq 0.6$ and $Y=1-X$). The material for PCM 464 can be chosen based upon ON state resistivity, OFF state electric field breakdown threshold, crystallization temperature, melting temperature, or other considerations. PCM 464 can be deposited, for example, by PVD sputtering, CVD, evaporation, or atomic layer deposition (ALD). In one implementation, PCM 464 can have a thickness of approximately five hundred angstroms to approximately two thousand angstroms (500 Å-2000 Å). In other implementations, PCM 464 can have any other thicknesses. The thickness of PCM 464 can be chosen based upon sheet resistance, crystallization power, amorphization power, or other considerations. Further shown in FIG. 17 is substrate 438 that underlies first dielectric 444 and heat spreader 440.

Figure 3B:
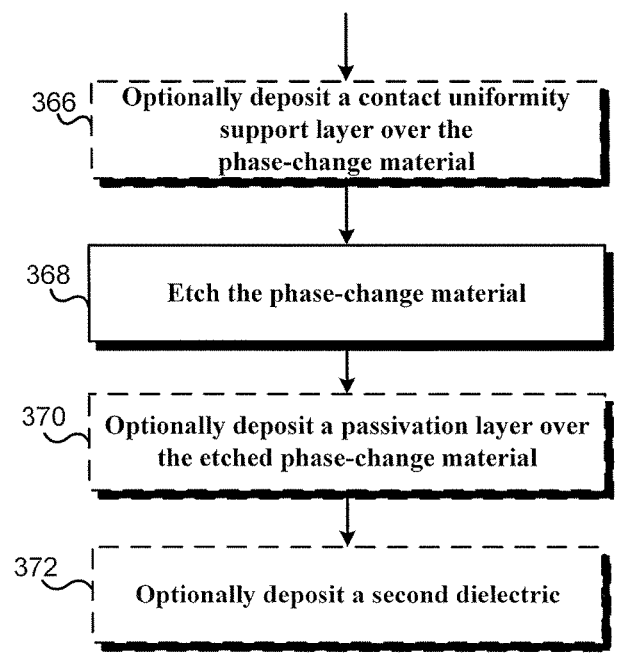

FIG. 3B is the remaining portion of the flowchart of FIG. 3A illustrating an exemplary method for manufacturing a PCM RF switch according to one implementation of the present application. Certain details and features have been left out of the flowchart that are apparent to a person of ordinary skill in the art. For example, an action may consist of one or more subactions or may involve specialized equipment or materials, as known in the art. Moreover, some actions, such as masking and cleaning actions, are omitted so as not to distract from the illustrated actions. Actions shown with dashed lines are considered optional. Actions 366 through 372 shown in the flowchart of FIG. 3B are sufficient to describe one implementation of the present inventive concepts, other implementations of the present inventive concepts may utilize actions different from those shown in the flowchart of FIG. 3B. Moreover, structures shown in FIGS. 18 through 21 illustrate the results of performing actions 366 through 372 in the flowchart of FIG. 3B.

Figure 18:
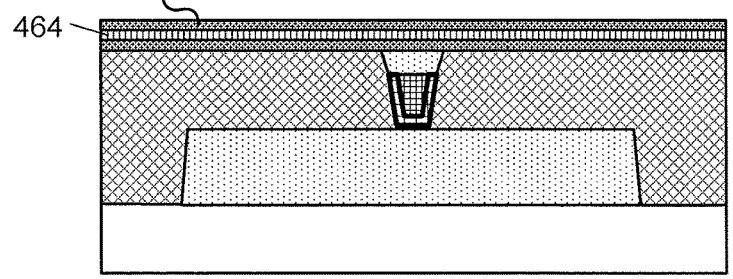

The method optionally continues with action 366 with depositing a contact uniformity support layer over the phase-change material. Referring to FIG. 18, contact uniformity support layer 466 is deposited over PCM 464. In one implementation, contact uniformity support layer 466 is $Si_XN_Y$. Contact uniformity support layer 466 can be deposited, for example, by PECVD or HDP-CVD. In one implementation, contact uniformity support layer 466 can have a thickness of approximately fifty angstroms to approximately two thousand angstroms (50 Å-2000 Å). By depositing contact uniformity support layer 466 as shown in FIG. 18, during a subsequent etching of PCM contact holes, contact uniformity support layer 466 performs as an etch stop. In this implementation, etching PCM contact holes may comprise two different etching actions. In the first etching action, a second dielectric, such as second dielectric 472 in FIG. 21, can be aggressively etched to form most of the PCM contact holes. This first etching action can use a selective etch, for example, a fluorine-based plasma dry etch, and contact uniformity support layer 466 can perform as an etch stop while second dielectric 472 is selectively etched. In the second etching action, contact uniformity support layer 466 can be etched less aggressively. As a result, PCM 464 will remain substantially intact, and uniform contact can be made to PCM 464. Because the $R_{ON}$ of a PCM RF switch, such as PCM RF switch 110 in FIG. 1B, depends heavily on the uniformity of contacts made with PCM 464, the $R_{ON}$ will be significantly lower when optional contact uniformity support layer 466 is used. In one implementation, contact uniformity support layer 466 is substantially thinner than second dielectric 472. Action 366 is optional in that the inventive concepts of the present application may be implemented without depositing contact uniformity support layer 466.

Figure 19:
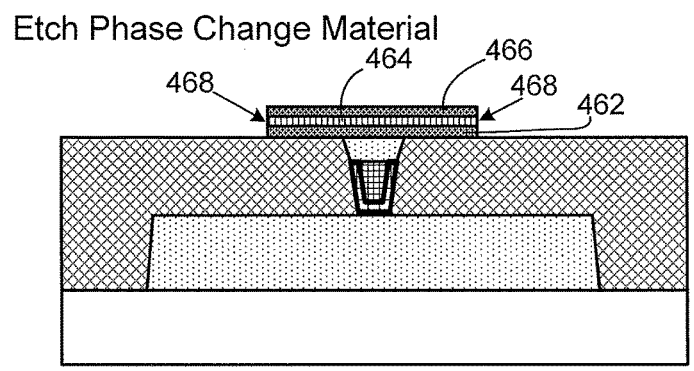

The method continues with action 368 with etching the phase-change material. Referring to FIG. 19, outer segments of PCM 464 are etched away, leaving sides 468. In the present implementation, outer segments of contact uniformity support layer 466 and conformability support layer 462 are also etched away. In one implementation, a fluorine-based plasma dry etch is used. By etching PCM 464 as shown in FIG. 19, a maximum channel length of the PCM RF switch, and a maximum separation of contacts, can be determined.

Figure 20:
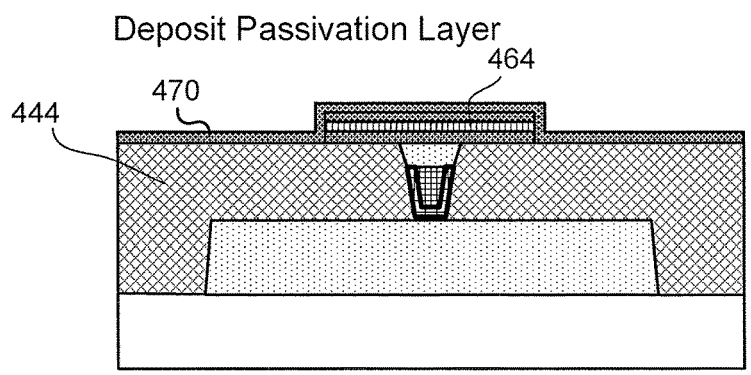

The method optionally continues with action 370 with depositing a passivation layer over the etched phase-change material. Referring to FIG. 20, passivation layer 470 is deposited over PCM 464. In the present implementation, passivation layer 470 is also deposited over first dielectric 444. In one implementation, passivation layer 470 is $SiO_2$. In another implementation, passivation layer 470 can be $Si_XN_Y$. Passivation layer 470 can be deposited, for example, by PECVD or HDP-CVD. In one implementation, passivation layer 470 can have a thickness of approximately fifty angstroms to approximately five hundred angstroms (50 Å-500 Å). Passivation layer 470 covers sides 468 (numbered in FIG. 19) of PCM 464. Action 370 is optional in that the inventive concepts of the present application may be implemented without depositing passivation layer 470.

Figure 21:
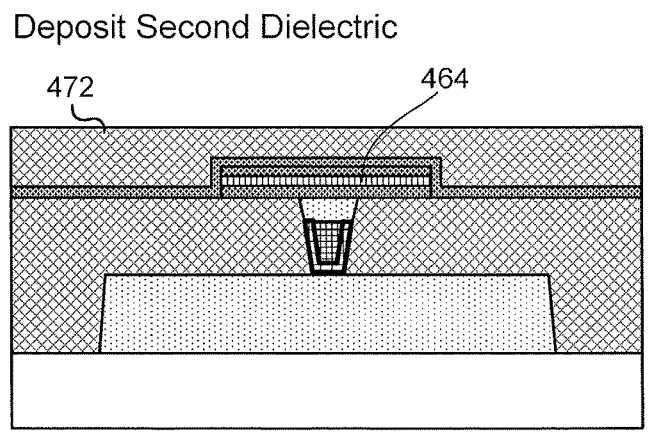

The method optionally continues with action 372 with depositing a second dielectric over any optional passivation layer, and the underlying layers (including any optional underlying layers). Referring to FIG. 21, second dielectric 472 is deposited over any optional passivation layer 470, and any underlying optional contact uniformity support layer 466 (numbered in FIG. 19), and PCM 464, and any optional conformability support layer 462 (numbered in FIG. 19). In one implementation, second dielectric 472 is $SiO_2$. In other implementations, second dielectric 472 is $Si_XN_Y$, or another dielectric. Second dielectric 472 can be deposited, for example, by PECVD or HDP-CVD. Referring to FIG. 21, second dielectric 472 is planarized so as to have a substantially planar top surface. In one implementation, CMP is used to planarize second dielectric 472. Action 372 is optional in that the inventive concepts of the present application may be implemented without depositing second dielectric 472.

By utilizing the methods disclosed in the present application, an RF switch employing phase-change material 464 can be reliably manufactured. Heat spreader 440 performs as an etch stop layer during etching of trench 448, and can remain in the final PCM RF switch to dissipate heat and quench PCM 464 after each heat pulse. Heating element 452 is deposited using, for example, CMOS-compatible tungsten, and can receive crystallizing pulse 102 and amorphizing pulse 202. Etch back of heating element 452 can create recess 454 in large scale manufacturing to influence the thickness of thermally conductive and electrically insulating material 456 that remains over heating element 452. Because thicker thermally conductive and electrically insulating material 456 advantageously reduces $C_{OFF}$ between PCM contacts, such as input electrode 114 or output electrode 116 in FIG. 1B, and heating element 452, while thinner thermally conductive and electrically insulating material 456 improves heat transfer between heating element 452 and PCM 464, the present methods enable control over a critical design dimension. Further, thermally conductive and electrically insulating material 456 is deposited directly over and is self-aligned with heating element 452, allowing effective and efficient heat transfer to PCM 464. A PCM RF switch can therefore transition between OFF and ON states using lower power and/or quicker pulses.

Depositing liner 450 biases vertical heat dissipation from heating element 452 toward the active segment of PCM 464, rather than toward heat spreader 440, enabling a PCM RF to transition between OFF and ON states using even lower power and/or even quicker pulses. Depositing conformability support layer 462 reduces nonconformities in PCM 464, thus improving reliability. Depositing contact uniformity support layer 466 advantageously reduces $R_{ON}$.

Thus, various implementations of the present application achieve a method of manufacturing a PCM RF switch that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method of manufacturing a radio frequency (RF) switch, the method comprising:
   providing a heat spreader;
   depositing a first dielectric over said heat spreader;
   etching a trench in said first dielectric;
   depositing a heating element in said trench and over at least a portion of said first dielectric;
   depositing a thermally conductive and electrically insulating material over at least said heating element;
   substantially planarizing said thermally conductive and electrically insulating material with said first dielectric;
   depositing a conformability support layer over said first dielectric and said thermally conductive and electrically insulating material;
   depositing a phase-change material over said conformability support layer.

2. The method of claim 1, wherein said conformability support layer comprises a material selected from the group consisting of silicon nitride ($Si_XN_Y$) and silicon oxide ($SiO_2$).

3. The method of claim 1, wherein said thermally conductive and electrically insulating material is self-aligned with said heating element.

4. The method of claim 1, wherein said phase-change material comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

5. The method of claim 1, wherein said heat spreader comprises a material selected from the group consisting of silicon (Si), aluminum nitride (AlN), aluminum oxide ($Al_XO_Y$), beryllium oxide ($Be_XO_Y$), silicon carbide (SiC), diamond, and diamond-like carbon.

6. The method of claim 1, wherein said heat spreader performs as an etch stop during said etching said trench in said first dielectric.

7. The method of claim 1, further comprising depositing a contact uniformity support layer over said phase-change material.

8. The method of claim 1, further comprising:
   etching said phase-change material;
   depositing a passivation layer over said etched phase-change material.

9. The method of claim 1, further comprising forming a recess in said trench and over said heating element prior to depositing said thermally conductive and electrically insulating material.

10. A method of manufacturing a radio frequency (RF) switch, the method comprising:
    providing a heat spreader;
    depositing a first dielectric over said heat spreader;
    etching a trench in said first dielectric;
    depositing a heating element in said trench and over at least a portion of said first dielectric, and forming a recess over said heating element in said trench;
    depositing a thermally conductive and electrically insulating material in said recess;
    depositing a phase-change material over said first dielectric and said thermally conductive and electrically insulating material.

11. The method of claim 10, further comprising substantially planarizing said thermally conductive and electrically insulating material with said first dielectric prior to said depositing said phase-change material.

12. The method of claim 10, wherein said thermally conductive and electrically insulating material is self-aligned with said heating element.

13. The method of claim 10, wherein said phase-change material comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

14. The method of claim 10, wherein said heat spreader comprises a material selected from the group consisting of silicon (Si), aluminum nitride (AlN), aluminum oxide ($Al_XO_Y$), beryllium oxide ($Be_XO_Y$), silicon carbide (SiC), diamond, and diamond-like carbon.

15. The method of claim 10, wherein said heat spreader performs as an etch stop during said etching said trench in said first dielectric.

16. The method of claim 10, wherein said heating element comprises a material selected from the group consisting of tungsten (W), molybdenum (Mo), titanium (Ti), titanium nitride (TiN), titanium tungsten (TiW), tantalum (Ta), nickel chromium (NiCr), and nickel chromium silicon (NiCrSi).

17. The method of claim 10, wherein said thermally conductive and electrically insulating material comprises a material selected from the group consisting of aluminum nitride (AlN), aluminum oxide ($Al_XO_Y$), beryllium oxide ($Be_XO_Y$), silicon carbide (SiC), silicon nitride ($Si_XN_Y$), diamond, and diamond-like carbon.

18. The method of claim 10, further comprising depositing a contact uniformity support layer over said phase-change material.

19. The method of claim 10, further comprising:
    etching said phase-change material;
    depositing a passivation layer over said etched phase-change material.

* * * * *